United States Patent
Hoshino (10) Patent No.: US 8,432,468 B2
(45) Date of Patent: Apr. 30, 2013

(54) COMPOSITE LOW FREQUENCY CUTOFF FILTER AND IMAGING APPARATUS USING THE SAME

(75) Inventor: Takayuki Hoshino, Osaka (JP)

(73) Assignee: Panasonic Corporation, Osaka (JP)

(*) Notice: Subject to any disclaimer, the term of this patent is extended or adjusted under 35 U.S.C. 154(b) by 407 days.

(21) Appl. No.: 12/783,718

(22) Filed: May 20, 2010

(65) Prior Publication Data
US 2010/0302386 A1    Dec. 2, 2010

(30) Foreign Application Priority Data
May 28, 2009  (JP) .................................. 2009-128458

(51) Int. Cl.
*H04N 3/14*    (2006.01)
*H04N 5/335*    (2011.01)

(52) U.S. Cl.
USPC ........... 348/294; 348/298; 348/302; 348/308; 348/312

(58) Field of Classification Search .......... 348/294–324, 348/208.1, 208.3, 208.6, 208.13, 208.99; 250/208.1; 257/290–292
See application file for complete search history.

(56) References Cited

U.S. PATENT DOCUMENTS
5,870,147 A  *  2/1999  Sugiyama .................. 348/409.1
2007/0092074 A1 *  4/2007  Takada ...................... 379/406.08

FOREIGN PATENT DOCUMENTS
| JP | 61-19219 | 1/1986 |
| JP | 9-14265 | 1/1997 |
| JP | 10-65956 | 3/1998 |
| JP | 2006-340190 | 12/2006 |
| JP | 2007-324929 | 12/2007 |

* cited by examiner

*Primary Examiner* — Yogesh Aggarwal
(74) *Attorney, Agent, or Firm* — Panasonic Patent Center (57) ABSTRACT

An imaging apparatus includes a composite low frequency cutoff filter. The composite low frequency cutoff filter includes a first low frequency cutoff filter, a second low frequency cutoff filter, and an adder-subtractor. The second low frequency cutoff filter receives an output of the first low frequency cutoff filter. The adder-subtractor subtracts an output of the second low frequency cutoff filter from an input to the composite low frequency cutoff filter, and outputs a result of the subtraction to the first low frequency cutoff filter. An output of the first low frequency cutoff filter is outputted as an output of the composite low frequency cutoff filter.

13 Claims, 8 Drawing Sheets

PRIOR ART

COMPOSITE LOW FREQUENCY CUTOFF FILTER AND IMAGING APPARATUS USING THE SAME

BACKGROUND

1. Technical Field

The technical field relates to a low frequency cutoff filter which is used for a camera shake correction for an imaging apparatus such as a digital still camera or a digital video camera.

2. Related Art

Some of imaging apparatuses such as digital still cameras and digital video cameras have a camera shake correction function. Such imaging apparatuses have a camera shake correction system (stabilizer) which calculates a camera shake angle by integral of an angular rate detected by an angular rate sensor and drive a correction lens or an imaging device according to the camera shake angle, thereby canceling a camera shake (see, for example, JP2007-324929A). A detection output from the angular rate sensor includes extremely low frequency fluctuating components in addition to components of a camera shake angular rate desired to be detected. Hence, in the camera shake correction system, a low frequency cutoff filter for cutting off a direct current component is provided at a stage preceding an integral process.

In addition, in the camera shake correction system, an integrator is provided to convert an angular rate detected by the angular rate sensor to an angle. It is desirable that the integrator ideally have complete integral characteristics in a camera shake correction band (about 1 to 20 Hz) which is a frequency range where the camera shake correction function is performed. However, when the integrator has complete integral characteristics even for extremely low frequencies, an extremely low frequency fluctuating component from the angular rate sensor is also amplified and thus excellent camera shake correction performance cannot be obtained. Therefore, the integrator has, at the extremely low frequencies, the characteristics of a first-order lag system in which the band is limited to prevent gain from increasing, and has a phase lead at 1 Hz as a lower limit of the camera shake correction band.

Meanwhile, conventionally, various filter technologies for performing phase compensation have been developed (see, for example, JP2006-340190A). JP2006-340190A discloses means to provide the best phase characteristic in a passing band with a basic filter unit and a second or higher order filter.

As described above, in conventional imaging apparatuses, in an output signal from the angular rate sensor, the integral band of the integrator is limited and furthermore a low frequency cutoff filter is provided, in order to reduce extremely low frequency fluctuating components which are included in the output of the angular rate sensor and are other than an angular rate component. Such limitation on the integral band of the integrator and the low frequency cutoff filter cause the phase on the low frequency side of the camera shake correction band to advance. Therefore, the phases of the actual camera shake angle and a correction angle do not match each other, resulting in a large correction residual. Accordingly, there is a problem that a sufficient suppression effect cannot be secured.

Although there is another method in which the order of the filter is increased to allow the phases to match each other, it has problems, for example, that the increase in the order of the filter complicates a computation algorithm and that a circuit becomes complicated when the filter is configured by hardware.

SUMMARY

To solve such problems, a low frequency cutoff filter is provided that can provide the best phase characteristic in a passing band using a simple computation algorithm. In addition, an imaging apparatus is provided that can obtain excellent camera shake correction performance on the low frequency side of a camera shake correction band.

In a first aspect, a composite low frequency cutoff filter is provided, which includes a first low frequency cutoff filter, a second low frequency cutoff filter, and an adder-subtractor. The second low frequency cutoff filter receives an output of the first low frequency cutoff filter. The adder-subtractor subtracts an output of the second low frequency cutoff filter from an input to the composite low frequency cutoff filter, and outputs a result of the subtraction to the first low frequency cutoff filter. An output of the first low frequency cutoff filter is outputted as an output of the composite low frequency cutoff filter.

In a second aspect, an imaging apparatus having a camera shake correction function is provided. The imaging apparatus includes an optical system, a shake correction member operable to move in a plane perpendicular to an optical axis of the optical system to perform a camera shake correction, a movement detector operable to detect movement of the imaging apparatus, a composite low frequency cutoff filter operable to receive an output of the movement detector, and a controller operable to drive the shake correction member based on an output of the composite low frequency cutoff filter. The composite low frequency cutoff filter includes a first low frequency cutoff filter, a second low frequency cutoff filter, and an adder-subtractor. The second low frequency cutoff filter receives an output of the first low frequency cutoff filter. The adder-subtractor subtracts an output of the second low frequency cutoff filter from an input to the composite low frequency cutoff filter, and outputs a result of the subtraction to the first low frequency cutoff filter. An output of the first low frequency cutoff filter is outputted as an output of the composite low frequency cutoff filter.

According to the above aspect, a low frequency cutoff filter that can obtain the best phase characteristic in a passing band using a simple computation algorithm can be implemented by combining a plurality of low frequency cutoff filters. In addition, in an imaging apparatus according to the present invention, the phase fluctuation of a camera shake correction system can be made to be zero on the low frequency side of a camera shake correction band. Thus, there is no phase difference between the actual camera shake and the movement of a camera shake correction lens, enabling to obtain excellent camera shake correction performance.

DETAILED DESCRIPTION OF PREFERRED EMBODIMENT

An embodiment of the present invention will be described below with reference to the accompanying drawings.

Figure 1:
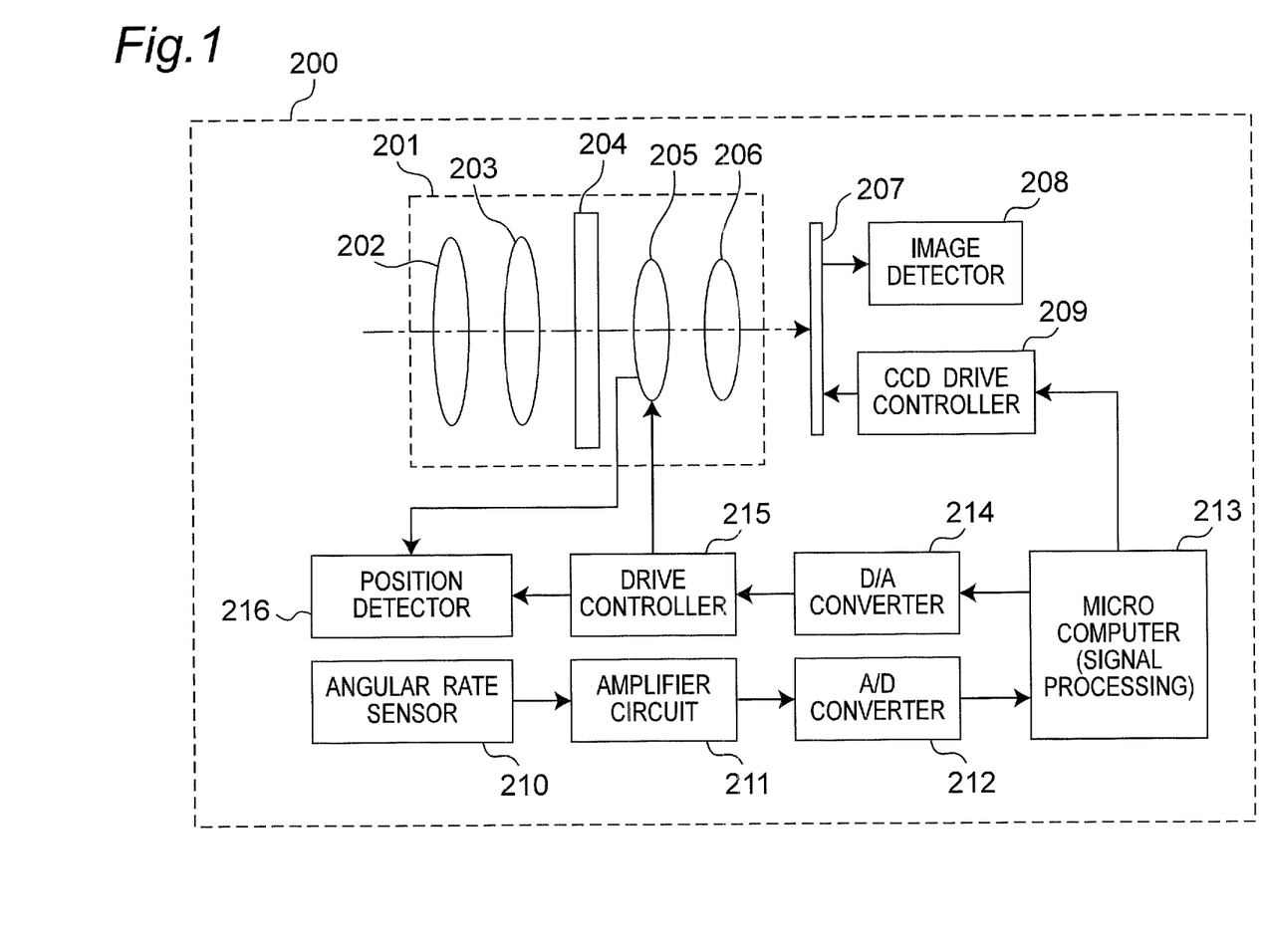
FIG. 1 is a schematic configuration diagram of an imaging apparatus having a camera shake correction optical system according to a preferred embodiment.

FIG. 1 is a schematic configuration diagram of an imaging apparatus having a camera shake correction optical system according to the preferred embodiment. An imaging apparatus 200 includes an optical system 201. The optical system 201 includes an objective lens 202, a zoom lens 203, a diaphragm 204, a camera shake correction lens 205, and a focus lens 206.

The imaging apparatus 200 further includes a CCD (charge-coupled device) 207 that generates image data from an optical signal incident thereon through the optical system 201, an image detector 208, and a CCD drive controller 209 that drives the CCD 207.

The imaging apparatus 200 further includes an angular rate sensor 210, an amplifier circuit 211 for amplifying an output signal from the angular rate sensor 210, an A/D converter 212 that converts an output signal from the amplifier circuit 211 which is an analog signal to a digital signal, and a microcomputer 213 that generates a control signal for driving the camera shake correction lens 205 based on the digital data converted by the A/D converter 212.

The imaging apparatus 200 further includes a D/A converter 214 that converts a digital output from the microcomputer 213 to an analog signal, a drive controller 215 for moving the camera shake correction lens 205, and a position detector 216 that detects a position of the camera shake correction lens 205.

An angular rate of shake of the imaging apparatus 200 is detected by the angular rate sensor 210 and is then fed to the microcomputer 213 through the amplifier circuit 211 and the A/D converter 212. The microcomputer 213 generates a position instruction signal for the shake correction lens 205 by performing a low frequency cutoff process for cutting off an unwanted direct current component included in the output of the angular rate sensor 210, an integration process for converting an angular rate to an angle, and so on. To do so, the microcomputer 213 is provided with a low frequency cutoff filter and an integrator (details of which will be described later). The position instruction signal is converted by the D/A converter 214 to an analog signal which is in turn fed to the drive controller 215. The drive controller 215 and the position detector 216 configure a position feedback system to position the shake correction lens 205 based on the position instruction signal.

Figure 2:
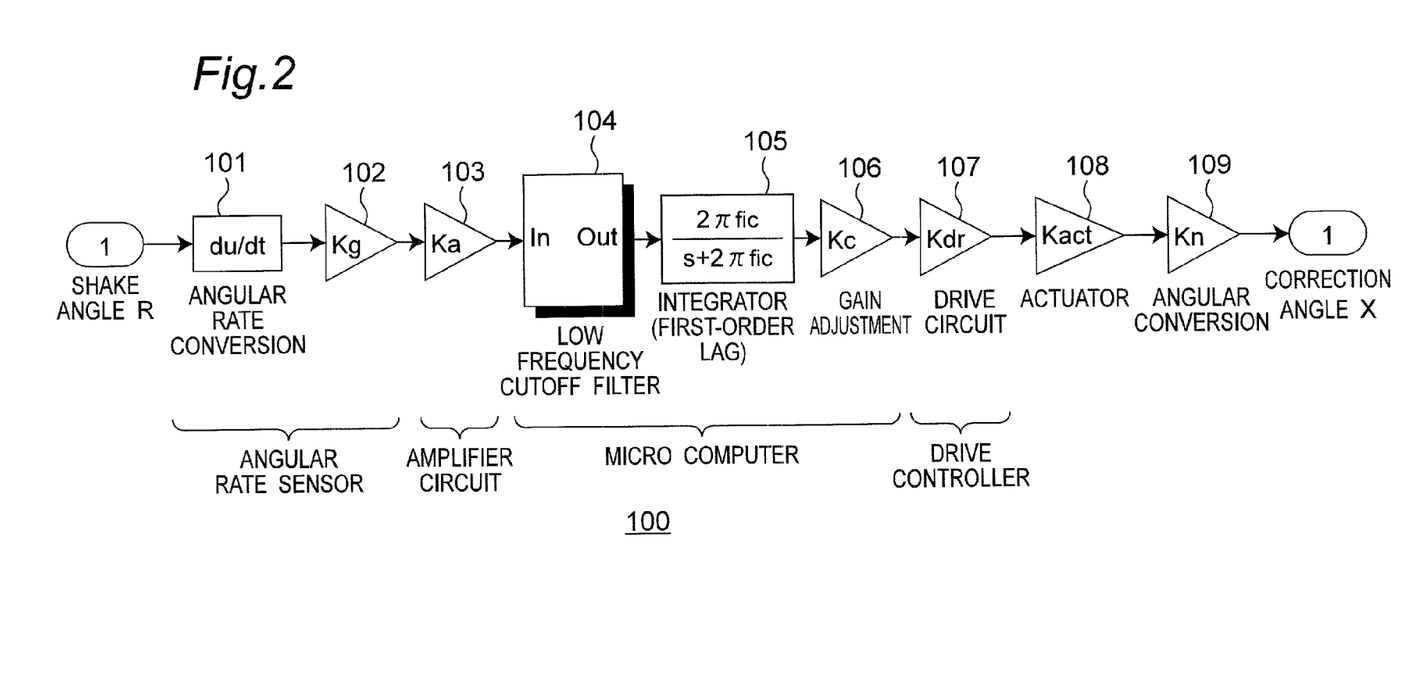
FIG. 2 is a block diagram for signal processing of a camera shake correction system according to the preferred embodiment.

FIG. 2 is a block diagram for signal processing of a camera shake correction system of the imaging apparatus 200. A camera shake correction system 100 is represented by an angular rate conversion block 101, an angular rate conversion coefficient 102, an amplification factor 103 of the amplifier circuit 211, a transfer characteristic of a low frequency cutoff filter 104, a transfer characteristic of an integrator 105, a gain adjustment coefficient 106, a drive circuit coefficient 107, an actuator conversion coefficient 108, and an angle conversion coefficient 109.

The angular rate conversion block 101 and the angular rate conversion coefficient 102 are implemented by the angular rate sensor 210 shown in FIG. 1. Operation of the low frequency cutoff filter 104, the integrator 105, and the gain adjustment 106 is performed by the microcomputer 213 shown in FIG. 1. The actuator 108 is configured by a position feedback system configured by the drive controller 215 and the position detector 216 which are described in FIG. 1, and changes the position of the camera shake correction lens 205 according to an input signal. Since a position of the camera shake correction lens 205 and a correction angle for canceling out a camera shake angle are optically determined, the angle conversion coefficient 109 is arranged in the block diagram.

Figure 3:
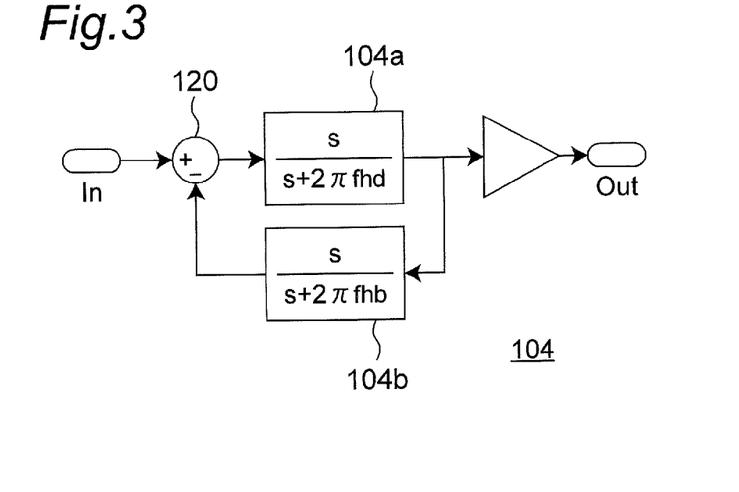
FIG. 3 is a diagram describing an exemplary configuration of a low frequency cutoff filter according to the preferred embodiment.

FIG. 3 is a specific exemplary configuration of the low frequency cutoff filter 104 included in the microcomputer 213 of the imaging apparatus 200 according to the present embodiment. The low frequency cutoff filter 104 is a composite low frequency cutoff filter including a plurality of first-order low frequency cutoff filters. Specifically, the low frequency cutoff filter 104 includes a first first-order low frequency cutoff filter 104*a*, a second first-order low frequency cutoff filter 104*b*, and an adder-subtractor 120. The low frequency cutoff filter 104 is configured such that an output from the second first-order low frequency cutoff filter 104*b* is negatively fed back to the first first-order low frequency cutoff filter 104*a*. In FIG. 3, fhd is the cutoff frequency of the first first-order low frequency cutoff filter 104*a* and fhb is the cutoff frequency of the second first-order low frequency cutoff filter 104*b*. The transfer characteristic of the low frequency cutoff filter 104 is as shown in an equation (1).

$$G = \frac{s \cdot (s + 2\pi fhb)}{s^2 + \pi(fhd + fhb) \cdot s + 2\pi^2 \cdot fhd \cdot fhb} \tag{1}$$

The equation (1) is further generalized as an equation (2), $$G = K \cdot \frac{s \cdot (s + \omega_0)}{s^2 + 2 \cdot \zeta \cdot \omega_n \cdot s + \omega_n^2} \tag{2}$$

where G is the transfer characteristic of the low frequency cutoff filter 104, K is the proportional gain, s is the Laplace operator, $\zeta$ is the damping coefficient, $\omega_n$ is the first angular frequency, and $\omega_0$ is the second angular frequency.

Figure 4:
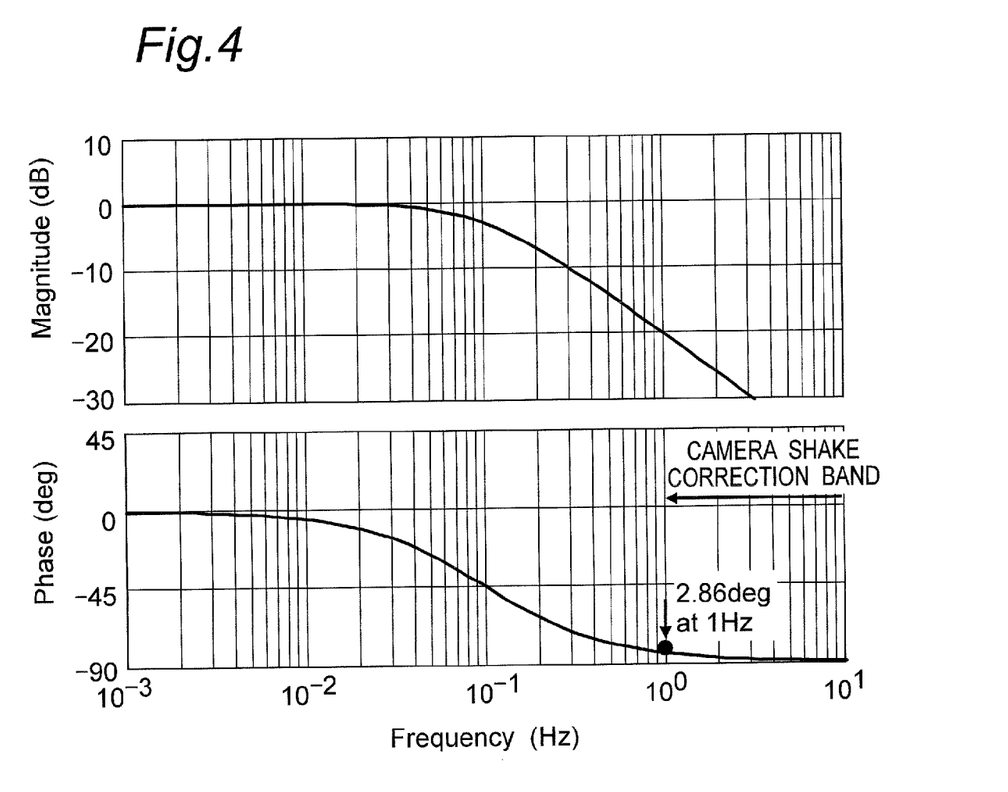
FIG. 4 is a diagram describing the frequency characteristics of an integrator.

FIG. 4 is a diagram showing a simulation result of the frequency characteristics of the integrator 105. Since an angular rate detected by the angular rate sensor 210 is converted to an angle, it is desirable that the integrator 105 has complete integral characteristics in a camera shake correction band. However, when the integrator 105 has complete integral characteristics even for extremely low frequencies, extremely low frequency fluctuating components from the angular rate sensor 210 are also amplified so that excellent camera shake correction performance cannot be obtained. Therefore, the integrator 105 has, at the extremely low frequencies, the characteristic of a first-order lag system in which the band is limited to prevent gain from increasing, and has a cutoff frequency fic selected to be 1/20 of 1 Hz as a lower limit of the camera shake correction band. The phase $\Phi_I$ (at 1 Hz) which is a phase at 1 Hz is shown as an equation (3).

$$\Phi_I(\text{at1Hz}) = \tan^{-1}(1\text{Hz}/50\text{mHz}) = -87.14 \text{ deg} \quad (3)$$

Thus, the phase lead amount $\Delta\Phi_I$ (at 1 Hz) with reference to −90 deg is 2.86 deg. This phase lead causes a mismatch between the actual camera shake angle and a correction angle, causing a reduction in camera shake suppression effect.

In view of the above, in the present embodiment, as shown in FIG. 3, using the two first-order low frequency cutoff filters 104a and 104b, the composite low frequency cutoff filter 104 is formed by negatively feeding an output of one first-order low frequency cutoff filter 104b back to the other first-order low frequency cutoff filter 104a. Hence, as will be described later, the phase can be delayed in a part of the band, enabling cancel of only a phase lead caused by the integrator 105 located at the subsequent stage.

Figure 5:
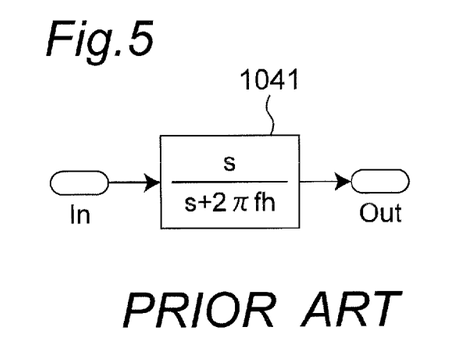
FIG. 5 is a diagram describing an exemplary configuration of a conventional low frequency cutoff filter.

The characteristics of the low frequency cutoff filter 104 and the camera shake correction system 100 of the imaging apparatus 200 according to the present embodiment will be described below, comparing with a conventional case. Note that a low frequency cutoff filter to be used in a conventional imaging apparatus is a first-order low frequency cutoff filter having a configuration such as that shown in FIG. 5. Here, a reduction factor required at a frequency of 3 mHz is 1/10 and the cutoff frequency fh of a conventional low frequency cutoff filter 1041 is 30 mHz.

(1) Frequency Characteristics of Low Frequency Cutoff Filter

Figure 6:
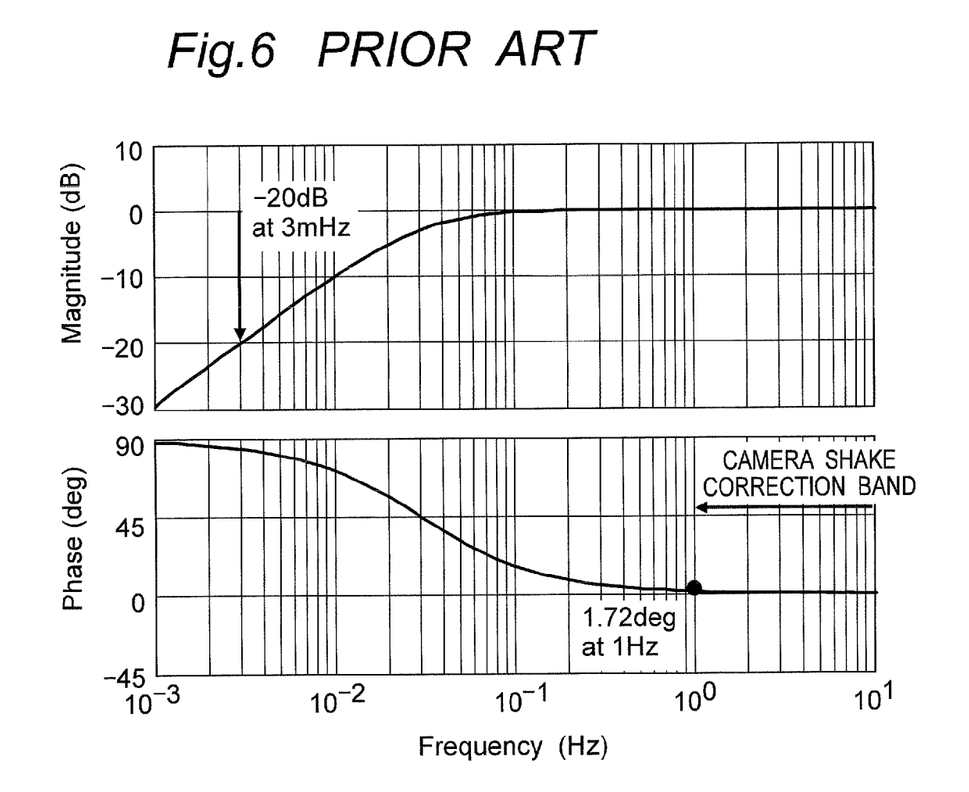
FIG. 6 is a diagram describing the frequency characteristics of the conventional low frequency cutoff filter.

FIG. 6 is a diagram showing a simulation result of the frequency characteristics of the conventional low frequency cutoff filter 1041. At 3 mHz, a required reduction factor of 1/10 (−20 dB) is secured. The phase $\Phi_A$ (at 1 Hz) at 1 Hz as a lower limit of the camera shake correction band is as shown in an equation (4).

$$\Phi_A(\text{at1Hz}) = \tan^{-1}(30\text{mHz}/1\text{Hz}) = 1.72 \text{ deg} \quad (4)$$

At the lower limit of the camera shake correction band of 1 Hz, there is a phase lead of 1.72 deg. As such, in the conventional low frequency cutoff filter 1041, the phase lead occurs in a region near the lower limit of the camera shake correction band.

Figure 7:
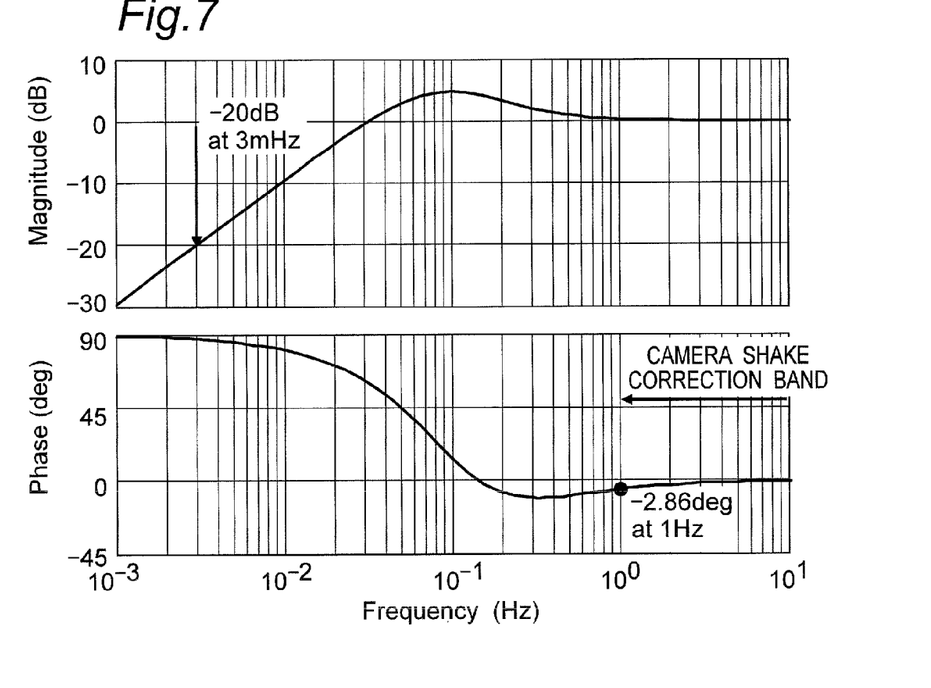
FIG. 7 is a diagram describing the frequency characteristics of the low frequency cutoff filter according to the preferred embodiment.

FIG. 7 is a diagram showing the frequency characteristics of the low frequency cutoff filter 104 according to the present embodiment with the cutoff frequency fhd of the first first-order low frequency cutoff filter 104a as 60 mHz and the cutoff frequency fhb of the second first-order low frequency cutoff filter 104b as 270 mHz. The frequency characteristics are different from those of the conventional low frequency cutoff filter 1041 shown in FIG. 6 in that over a band of 0.15 Hz to 10 Hz the phase is negative and a phase lag occurs. In order to cancel a phase of the integrator 105 at 1 Hz of 2.86 deg, the low frequency cutoff filter 104 is designed so that the phase at 1 Hz is −2.86 deg. In addition, at 3 mHz as a frequency of an extremely low frequency fluctuating component which is included in an output from the angular rate sensor 210 and is a frequency component other than the angular rate of the camera shake, a reduction factor of 1/10 is secured similarly to the conventional low frequency cutoff filter 1041.

By the low frequency cutoff filter 104 thus having a phase lag amount on the low frequency side of the camera shake correction band, a phase lead in the integrator 105 at the subsequent stage can be cancelled out.

(2) Frequency characteristics of Camera Shake Correction System

Figure 8:
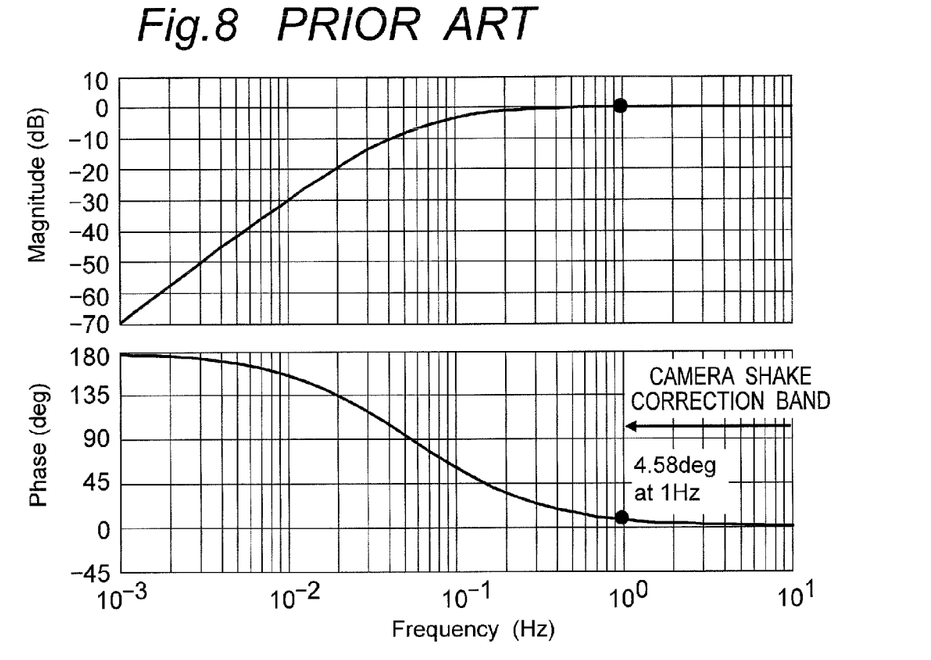
FIG. 8 is a diagram describing the frequency characteristics of a conventional camera shake correction system.
Figure 9:
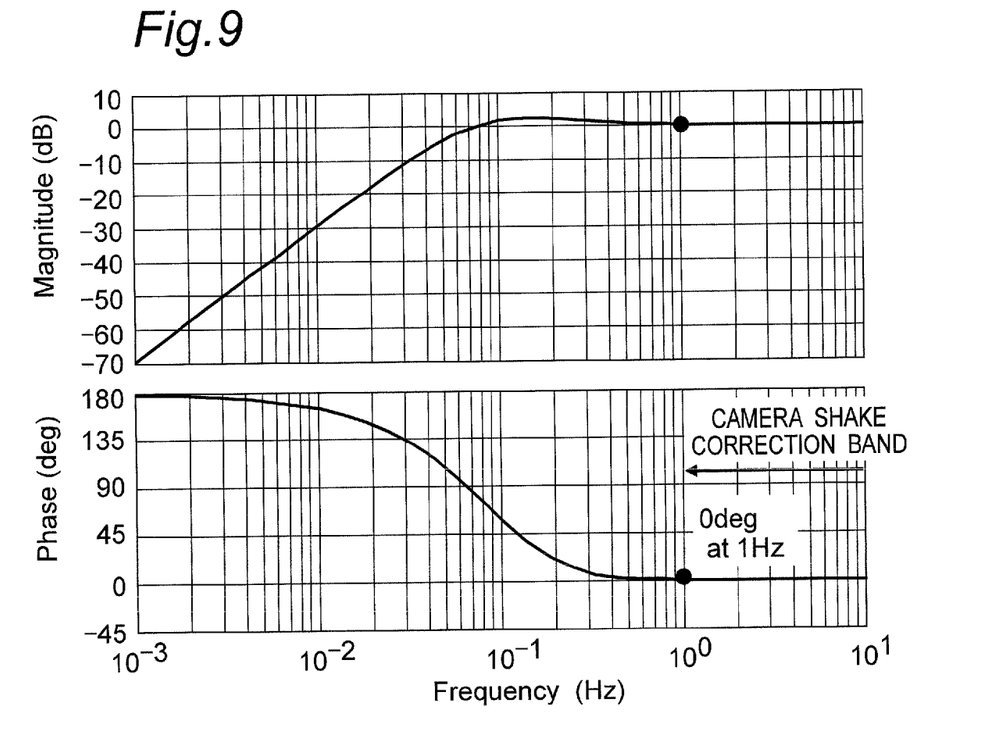
FIG. 9 is a diagram describing the frequency characteristics of the camera shake correction system according to the preferred embodiment.

FIG. 8 shows d simulation result of frequency characteristics for the case in which the conventional low frequency cutoff filter 1041 is applied to the configuration of the camera shake correction system 100 shown in FIG. 2 (that is, the configuration in FIG. 2 with the low frequency cutoff filter 104 replaced by the low frequency cutoff filter 1041). FIG. 9 shows a simulation result of the frequency characteristics of the camera shake correction system 100 including the low frequency cutoff filter 104 in the present embodiment.

Generally, it is preferred that the gain be 0 dB and the phase be 0 deg over the camera shake correction band. When the conventional low frequency cutoff filter 1041 is used, as shown in FIG. 8, the gain is substantially 0 dB over the camera shake correction band. However, the phase at a frequency near 1 Hz is not 0 deg due to the influence of a phase lead $\Phi_A$ produced by the low frequency cutoff filter 1041 and a phase lead $\Delta\Phi$ produced due to the band limitation of the integrator 105. That is, the phase lead at 1 Hz is 4.58 deg which is the total of $\Phi_A$ and $\Delta\Phi_1$.

On the other hand, in the case of the camera shake correction system 100 using the low frequency cutoff filter 104 according to the present embodiment, as shown in FIG. 9, the phase at a frequency near 1 Hz is substantially 0 deg. That is, at 1 Hz, a phase lead $\Delta\Phi_Z$ (at 1 Hz) produced by the integrator 105 which is equal to 2.86 deg and a phase $\Phi_A$ (at 1 Hz) of the low frequency cutoff filter 104 which is equal to −2.86 deg are cancelled each other, resulting in a phase lead of 0 deg.

(3) Frequency Characteristics for Camera Shake Correction Residual

Figure 10:
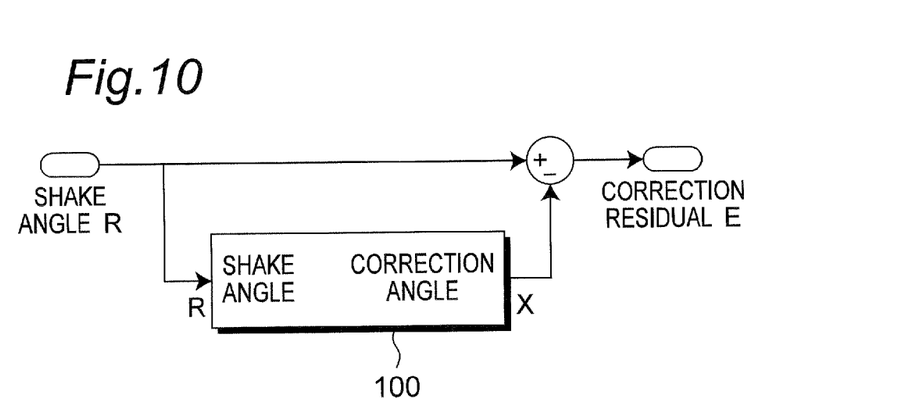
FIG. 10 is a block diagram for determining a camera shake correction residual.

FIG. 10 is a block diagram for determining a camera shake correction residual. The result of subtraction of a correction angle X obtained by the camera shake correction system 100 from the actual camera shake angle R is a camera shake correction residual E. Performance of a camera shake correction can be evaluated by the camera shake correction residual in the camera shake correction band (about 1 to 20 Hz). In other words, the performance can be evaluated to be higher as the camera shake correction residual is lower.

Figure 11:
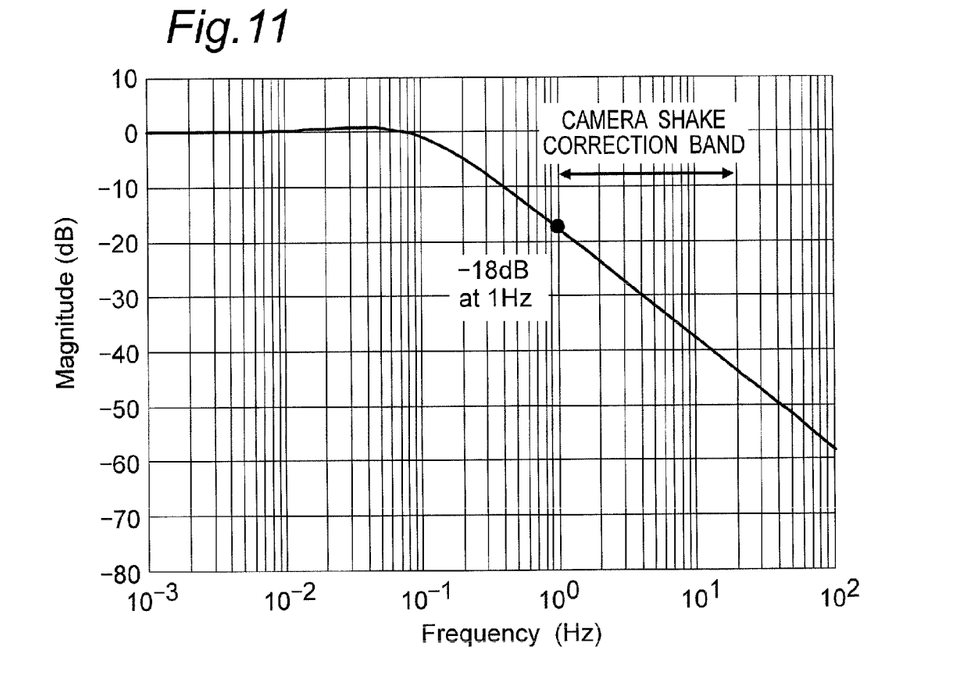
FIG. 11 is a diagram describing a frequency characteristic for a camera shake angle and a camera shake correction residual for a conventional case.

FIG. 11 shows a simulation result of the frequency characteristic for the camera shake angle and the camera shake correction residual when the conventional low frequency cutoff filter 1041 is used. Note that a gain of 0 dB indicates that the camera shake angle R is equal to the camera shake correction residual E and there is no effect of camera shake suppression by the camera shake correction system 100. Needless to say, it is desirable that the gain be low in the camera shake correction band (it is desirable that a suppression factor be large because the suppression factor is the reciprocal of the gain). In FIG. 11, there is a tendency that the suppression factor is smallest (the gain is highest) at 1 Hz which is the lower limit of the camera shake correction band, and the suppression factor is larger as the frequency is higher (the gain is lower). Due to the phase lead described in FIG. 8, the suppression factor at 1 Hz is 18 dB.

Here, a required suppression factor will be described briefly. When the pixel pitch of the CCD 207 is 1.5 μm and the pixel shake caused by camera shake is allowed for three pixels, the allowable shake is 4.5 μm as converted to the image plane position of the CCD 207. The relationship between the camera shake angle θ and the image plane position x of the CCD 207 is as shown in an equation (5).

$$x = f \cdot \tan\theta \quad (5)$$

where f is the focal length. When f=15 mm, the camera shake correction residual is 0.0172 deg. Assuming that a camera shake of the order of 0.3 deg occurs, the camera shake needs to be suppressed to 0.0172 deg and thus the required suppression factor is about 25 dB. Accordingly, with a value of 18 dB shown in FIG. 11, a sufficient camera shake suppression effect cannot be obtained.

Figure 12:
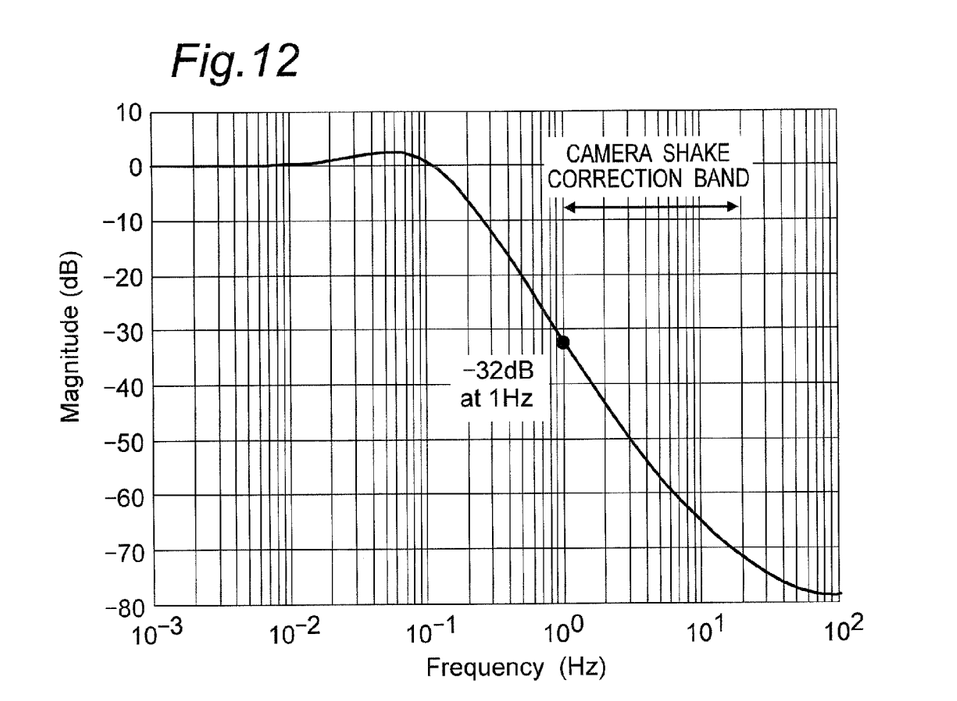
FIG. 12 is a diagram describing a frequency characteristic for a camera shake angle and a camera shake correction residual in the preferred embodiment.

FIG. 12 shows a simulation result of the frequency characteristic for the camera shake angle and the camera shake correction residual when the low frequency cutoff filter 104 in the present embodiment is used. The low frequency cutoff filter 104 included in the camera shake correction system 100 has the configuration shown in FIG. 3. In FIG. 12, a tendency that the suppression factor is smallest (the gain is highest) at 1 Hz which is the lower limit of the camera shake correction band and the frequency becomes higher as the suppression factor is larger is same as that for the conventional case shown in FIG. 11. However, the suppression factor at 1 Hz is 32 dB, which indicates that a sufficient camera shake suppression effect is obtained compared to the conventional case in which the suppression factor at 1 Hz is 18 dB.

(4) Frequency Characteristics upon varying Cutoff Frequency

Figure 13:
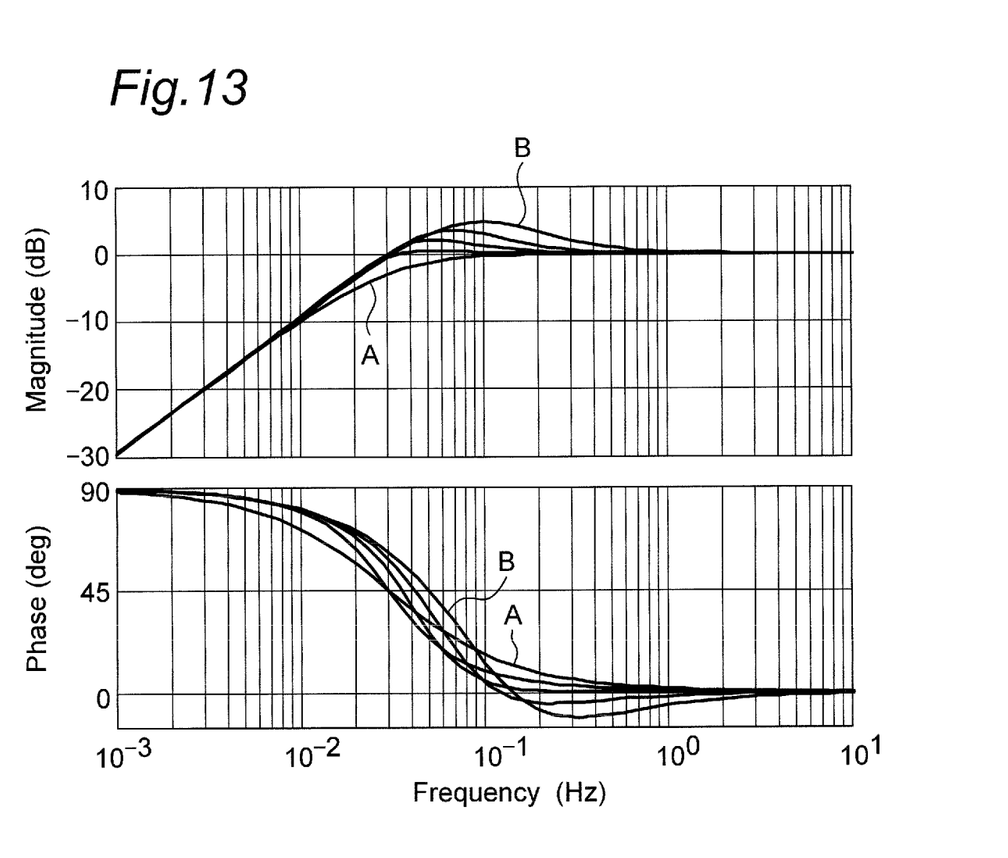
FIG. 13 is a diagram describing frequency characteristics with a parameter of the low frequency cutoff filter being changed.

FIG. 13 is a diagram showing a simulation result of the frequency characteristics of the low frequency cutoff filter 104 for the case in which the cutoff frequency fhb of the second first-order low frequency cutoff filter 104b is varied. For comparison, FIG. 13 also shows the characteristics of the conventional low frequency cutoff filter 1041. Characteristics A exhibiting the gentlest phase characteristic and the gentlest gain characteristic are the characteristics of the conventional low frequency cutoff filter 1041.

In FIG. 13, characteristics B, in which the phase moves farthest in a negative direction (phase lag direction) and the peak gain is highest in a band of 0.1 Hz to 1 Hz, are the characteristics for the case in which the cutoff frequency fhb is 270 mHz. When reducing the cutoff frequency fhb further, the peak of the gain decreases further and accordingly the phase does not move in the negative direction, that is, the phase is not delayed.

When the cutoff frequency fhd of the first first-order low frequency cutoff filter 104a and the cutoff frequency fhb of the second first-order low frequency cutoff filter 104b of the low frequency cutoff filter 104 are set to the same frequency, 60 mHz, the phase does not move in the negative direction. In the case of fhb=fhd, the phase does not move in the negative direction (phase lag direction), and thus a phase lead caused by the band limitation of the integrator 105 cannot be cancelled. Hence, in order to make the phase move in the negative direction (phase lag direction) to cancel out the phase lead, fhb needs to be greater than fhd.

As described above, extremely low frequency fluctuating components other than camera shake angular components included in an output from the angular rate sensor 210 is attributed to the performance of the angular rate sensor 210. However, if the performance is improved in the future to reduce the extremely low frequency fluctuating components, then it is also possible to lower the cutoff frequency of the integrator 105. Even in such a case, according to the present embodiment, it is possible to design so that the phase at a specific frequency is 0 deg, by controlling the cutoff frequency fhb of the second first-order low frequency cutoff filter 104b of the low frequency cutoff filter 104.

The above-described embodiment is one example. The integrator 105 and the low frequency cutoff filter 104 can be implemented by hardware such as an operational amplifier in addition to execution of software.

In addition, since the focal length of the optical system 201 changes by the movement of the zoom lens 203, it is desirable to set the cutoff frequency fhb of the second first-order low frequency cutoff filter 104b to be higher for the longer focal length or be lower for the shorter focal length. When the focal length is short, a camera shake correction angle is small. When the camera shake correction angle is small, the apparatus is susceptible to an influence such as friction of the actuator, delaying the phase. At this time, by lowering the cutoff frequency fhb of the second first-order low frequency cutoff filter 104b, the phase advances to enable cancel of the phase lag.

Although in the present embodiment an imaging apparatus including a camera shake correction system of a so-called lens shift type which moves the camera shake correction lens 205 is exemplified, the idea of the present embodiment can also be applied to an imaging apparatus including a camera shake correction system of a so-called CCD (imaging device) shift type which moves the CCD 207. In addition, the idea of the present embodiment can be applied to an imaging apparatus including a camera shake correction system using a variable apex angle prism with a high refractive index liquid filled in a bellows portion.

In addition, the low frequency cutoff filter 104 shown in the present embodiment can also be used for applications other than detection for a camera shake correction. For example, the low frequency cutoff filter 104 can also be applied to shock detection techniques using an output from an acceleration sensor.

Industrial Applicability

According to the embodiment, there is no phase difference in the movement of a camera shake correction lens and thus excellent camera shake correction performance can be obtained. Thus, the embodiment can be applied to an imaging apparatus such as a digital still camera and a digital video camera. In addition, a composite low frequency cutoff filter of the embodiment can be widely applied in applications in which low frequency components are cut off but a phase shift is hardly allowed.

What is claimed is:

1. A composite low frequency cutoff filter comprising:
a first low frequency cutoff filter;
a second low frequency cutoff filter; and
an adder-subtractor,
wherein the second low frequency cutoff filter receives an output of the first low frequency cutoff filter,
the adder-subtractor subtracts an output of the second low frequency cutoff filter from an input to the composite low frequency cutoff filter, and outputs a result of the subtraction to the first low frequency cutoff filter, and
an output of the first low frequency cutoff filter is outputted as an output of the composite low frequency cutoff filter.

2. The composite low frequency cutoff filter according to claim 1, wherein a cutoff frequency of the second low frequency cutoff filter is higher than a cutoff frequency of the first low frequency cutoff filter.

3. An imaging apparatus having a camera shake correction function, the imaging apparatus comprising:
an optical system;
a shake correction member operable to move in a plane perpendicular to an optical axis of the optical system to perform a camera shake correction;
a movement detector operable to detect movement of the imaging apparatus;
a composite low frequency cutoff filter operable to receive an output of the movement detector; and a controller operable to drive the shake correction member based on an output of the composite low frequency cutoff filter, wherein the composite low frequency cutoff filter includes a first low frequency cutoff filter, a second low frequency cutoff filter, and an adder-subtractor, the second low frequency cutoff filter receives an output of the first low frequency cutoff filter, the adder-subtractor subtracts an output of the second low frequency cutoff filter from an input to the composite low frequency cutoff filter, and outputs a result of the subtraction to the first low frequency cutoff filter, and an output of the first low frequency cutoff filter is outputted as an output of the composite low frequency cutoff filter.

4. The imaging apparatus according to claim 3, wherein a cutoff frequency of the second low frequency cutoff filter is higher than a cutoff frequency of the first low frequency cutoff filter.

5. The imaging apparatus according to claim 3, wherein the shake correction member is a lens.

6. The imaging apparatus according to claim 3, wherein the shake correction member is an imaging device operable to generate image data from an optical signal.

7. The imaging apparatus according to claim 4, wherein the optical system has function of a variable magnification, and the controller sets the cutoff frequency of the second low frequency cutoff filter to be higher as a focal length of the optical system is longer.

8. The imaging apparatus according to claim 3, wherein the controller includes an integrator operable to integrate an output of the composite low frequency cutoff filter.

9. The imaging apparatus according to claim 3, wherein the movement detector is an angular rate sensor operable to detect an angular rate of the imaging apparatus.

10. The imaging apparatus according to claim 3, wherein the controller is a microcomputer operable to provide functions by executing a predetermined program.

11. The imaging apparatus according to claim 3, wherein the controller includes an integrator operable to integrate an output of the composite low frequency cutoff filter, wherein the composite low frequency cutoff filter and the integrator are configured so that during operation within a camera shake correction band, a gain is substantially equal to 0 dB and a phase is substantially equal to 0 degrees.

12. The imaging apparatus according to claim 11, wherein during operation within the camera shake correction band, a phase lead produced by the integrator is substantially canceled by a phase lead of the composite low frequency cutoff filter, thereby resulting in the phase of substantially 0 degrees.

13. The imaging apparatus according to claim 11, wherein the camera shake correction band is equal to a range from approximately 1 Hz to 20 Hz.

* * * * *